(12) United States Patent
Foad et al.

(10) Patent No.: US 9,508,375 B2
(45) Date of Patent: *Nov. 29, 2016

(54) MODIFICATION OF MAGNETIC PROPERTIES OF FILMS USING ION AND NEUTRAL BEAM IMPLANTATION

(75) Inventors: Majeed A. Foad, Sunnyvale, CA (US); Nir Merry, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 797 days.

This patent is subject to a terminal disclaimer.

(21) Appl. No.: 12/759,597

(22) Filed: Apr. 13, 2010

(65) Prior Publication Data
US 2010/0261040 A1 Oct. 14, 2010

Related U.S. Application Data

(60) Provisional application No. 61/168,879, filed on Apr. 13, 2009.

(51) Int. Cl.
*C23C 14/04* (2006.01)
*C23C 14/58* (2006.01)
(Continued)

(52) U.S. Cl.
CPC ............... *G11B 5/865* (2013.01); *B82Y 10/00* (2013.01); *C23C 14/042* (2013.01); *C23C 14/48* (2013.01);
(Continued)

(58) Field of Classification Search
CPC ....... G11B 5/743; G11B 5/746; B82Y 10/00; C23C 14/042; C23C 14/485826; C23C 14/5833; C23C 14/5853; C23C 14/5893; H01J 37/317; H01J 37/3171; H01J 37/3174; H01J 37/3175; H01J 37/3177; H01J 37/32366; H01J 37/32376; H01J 37/32412; H01J 2237/316; H01J 2237/3165; H01J 2237/31701; H01J 2237/31706; H01J 2237/3171; H01J 2237/31711; H01J 2237/336; H01J 2237/3365; H01J 2237/338; H05H 3/00–3/06

USPC ............... 427/523–531, 533–537, 539–540, 427/562–564, 569–579, 127–132
See application file for complete search history.

(56) References Cited

U.S. PATENT DOCUMENTS 3,117,022 A * 1/1964 Bronson et al. ............... 427/526
3,622,382 A * 11/1971 Brack et al. .................. 428/448
(Continued)

FOREIGN PATENT DOCUMENTS

JP 2009026435 A 2/2009
JP 2009205777 A 9/2009
(Continued)

OTHER PUBLICATIONS

Biorn-Hansen et al.; "The Use of Significant Figures and Rounding Conventions in Water Quality Permitting" (Rev 1.3); state of Oregon Department of environmental quality; Portland Oregon; updated Dec. 5, 2013.*
(Continued)

*Primary Examiner* — Marianne L Padgett
(74) *Attorney, Agent, or Firm* — Patterson & Sheridan, LLP

(57) ABSTRACT

Methods and apparatus for forming substrates having magnetically patterned surfaces is provided. A magnetic layer comprising one or more materials having magnetic properties is formed on the substrate. The magnetic layer is subjected to a patterning process in which selected portions of the surface of the magnetic layer are altered such that the altered portions have different magnetic properties from the non-altered portions without changing the topography of the substrate. A protective layer and a lubricant layer are deposited over the patterned magnetic layer. The patterning is accomplished through a number of alternative processes that expose substrates to energy of varying forms.

9 Claims, 5 Drawing Sheets

(51) Int. Cl.

| | | |
|---|---|---|
| *C23C 14/48* | (2006.01) | |
| *G11B 5/86* | (2006.01) | |
| *B82Y 10/00* | (2011.01) | |
| *G11B 5/74* | (2006.01) | |
| *G11B 5/855* | (2006.01) | |

(52) U.S. Cl.
CPC ....... *C23C 14/5833* (2013.01); *C23C 14/5853* (2013.01); *G11B 5/743* (2013.01); *G11B 5/746* (2013.01); *G11B 5/855* (2013.01); *C23C 14/5826* (2013.01); *H01J 2237/316* (2013.01); *H01J 2237/3165* (2013.01); *H01J 2237/31711* (2013.01)

(56) References Cited

U.S. PATENT DOCUMENTS

| | | | |
|---|---|---|---|
| 4,556,597 A | 12/1985 | Best et al. | |
| 4,560,879 A | 12/1985 | Wu et al. | |
| 4,686,162 A * | 8/1987 | Stangl et al. | 430/5 |
| 4,825,087 A | 4/1989 | Renau et al. | |
| 5,587,587 A * | 12/1996 | Hashimoto | H01J 37/026 250/251 |
| 5,723,033 A | 3/1998 | Weiss | |
| 5,757,018 A * | 5/1998 | Mack | H01J 37/244 250/251 |
| 5,777,438 A | 7/1998 | Suzuki | |
| 5,858,474 A | 1/1999 | Meyer et al. | |
| 5,883,391 A | 3/1999 | Adibi et al. | |
| 5,969,366 A * | 10/1999 | England | H01J 37/3007 250/492.21 |
| 5,977,552 A | 11/1999 | Foad | |
| 6,100,536 A | 8/2000 | Ito et al. | |
| 6,153,281 A * | 11/2000 | Meyer et al. | 428/848.5 |
| 6,168,845 B1 | 1/2001 | Fontana, Jr. et al. | |
| 6,200,883 B1 | 3/2001 | Taylor et al. | |
| 6,207,963 B1 * | 3/2001 | Benveniste | 250/492.21 |
| 6,359,286 B1 | 3/2002 | Ito et al. | |
| 6,368,425 B1 | 4/2002 | Segar et al. | |
| 6,377,414 B1 | 4/2002 | Wang | |
| 6,383,574 B1 | 5/2002 | Han et al. | |
| 6,476,402 B1 | 11/2002 | Yoo | |
| 6,510,015 B2 | 1/2003 | Sacks et al. | |
| 6,515,408 B1 | 2/2003 | England et al. | |
| 6,555,831 B1 | 4/2003 | Konishi et al. | |
| 6,583,018 B1 | 6/2003 | Matsunaga et al. | |
| 6,605,321 B1 * | 8/2003 | Ravelosona-Ramasitera et al. | 427/528 |
| 6,617,012 B1 * | 9/2003 | Wang et al. | 428/221 |
| 6,656,614 B1 | 12/2003 | Li et al. | |
| 6,706,363 B2 * | 3/2004 | Honda et al. | 428/835.4 |
| 6,749,904 B1 | 6/2004 | Liu et al. | |
| 6,753,043 B1 | 6/2004 | Kuo et al. | |
| 6,800,862 B2 | 10/2004 | Matsumoto et al. | |
| 6,849,349 B2 * | 2/2005 | Klemmer et al. | 428/826 |
| 6,864,042 B1 | 3/2005 | Kuo et al. | |
| 6,898,031 B1 | 5/2005 | Belser et al. | |
| 6,943,349 B2 | 9/2005 | Adamec et al. | |
| 7,038,225 B2 | 5/2006 | Kuo et al. | |
| 7,153,366 B1 | 12/2006 | Chen et al. | |
| 7,274,018 B2 | 9/2007 | Adamec et al. | |
| 7,394,079 B2 | 7/2008 | Saadatmand et al. | |
| 7,435,976 B2 | 10/2008 | Naito et al. | |
| 7,439,526 B2 | 10/2008 | Purser et al. | |
| 7,482,255 B2 | 1/2009 | Graoui et al. | |
| 7,501,638 B1 | 3/2009 | Zhou | |
| 7,504,619 B2 * | 3/2009 | Wolfe | B82Y 10/00 250/251 |
| 7,686,972 B2 * | 3/2010 | Hieda et al. | 216/67 |
| 8,354,035 B2 * | 1/2013 | Hilkene et al. | 216/22 |
| 8,535,766 B2 * | 9/2013 | Verhaverbeke et al. | 427/526 |
| 8,551,578 B2 * | 10/2013 | Nalamasu et al. | 427/526 |
| 8,586,952 B2 * | 11/2013 | Hilkene et al. | 250/492.3 |
| 8,658,242 B2 * | 2/2014 | Bencher et al. | 427/130 |
| 8,709,533 B2 * | 4/2014 | Sinclair et al. | 427/130 |
| 2003/0019739 A1 | 1/2003 | Shibamoto et al. | |
| 2003/0129850 A1 | 7/2003 | Olgado et al. | |
| 2003/0153157 A1 | 8/2003 | Foad et al. | |
| 2004/0090194 A1 | 5/2004 | Gesley | |
| 2004/0259036 A1 | 12/2004 | Chappert et al. | |
| 2005/0181584 A1 | 8/2005 | Foad et al. | |
| 2005/0184254 A1 | 8/2005 | Matsumoto et al. | |
| 2005/0218344 A1 * | 10/2005 | Starcher | 250/492.21 |
| 2006/0043316 A1 * | 3/2006 | Liebert et al. | 250/492.21 |
| 2006/0044946 A1 | 3/2006 | Phillips | |
| 2006/0113493 A1 * | 6/2006 | Kabasawa et al. | 250/492.21 |
| 2006/0124865 A1 * | 6/2006 | Wolfe | B82Y 10/00 250/492.1 |
| 2006/0172086 A1 * | 8/2006 | Nickel | 427/569 |
| 2006/0177594 A1 * | 8/2006 | Nickel | 427/523 |
| 2006/0197029 A1 * | 9/2006 | Purser et al. | 250/396 ML |
| 2006/0289800 A1 | 12/2006 | Murrell et al. | |
| 2007/0190328 A1 * | 8/2007 | Cowburn et al. | 428/409 |
| 2007/0288116 A1 * | 12/2007 | Al-Bayati et al. | 700/121 |
| 2008/0075845 A1 * | 3/2008 | Sonobe et al. | 427/130 |
| 2008/0138967 A1 | 6/2008 | Li et al. | |
| 2008/0169426 A1 | 7/2008 | Purser et al. | |
| 2008/0218772 A1 * | 9/2008 | Binns et al. | 356/622 |
| 2009/0237838 A1 * | 9/2009 | Fukushima et al. | 360/110 |
| 2010/0053813 A1 | 3/2010 | Fukushima et al. | |
| 2010/0096256 A1 * | 4/2010 | Nalamasu et al. | 204/192.34 |
| 2010/0098873 A1 * | 4/2010 | Verhaverbeke et al. | 427/526 |
| 2010/0165504 A1 | 7/2010 | Fukushima et al. | |
| 2010/0258431 A1 * | 10/2010 | Moffatt et al. | 204/192.11 |
| 2010/0258758 A1 * | 10/2010 | Foad et al. | 252/62.51 R |
| 2011/0006034 A1 * | 1/2011 | Hilkene et al. | 216/22 |
| 2011/0104393 A1 * | 5/2011 | Hilkene et al. | 427/526 |
| 2012/0196155 A1 * | 8/2012 | Bencher et al. | 428/836 |

FOREIGN PATENT DOCUMENTS

| | | | |
|---|---|---|---|
| KR | 20090011519 | 2/2009 | |
| WO | WO 2008/035520 A1 * | 3/2008 | G11B 5/65 |
| WO | WO 2008/035644 A1 * | 3/2008 | G11B 5/855 |

OTHER PUBLICATIONS

International Search Report and Written Opinion of the International Searching Authority mailed Sep. 15, 2010 in PCT/US2010/024163.

International Search Report and Written Opinion Dated Nov. 26, 2010, in International Application No. PCT/US2010/030924.

* cited by examiner

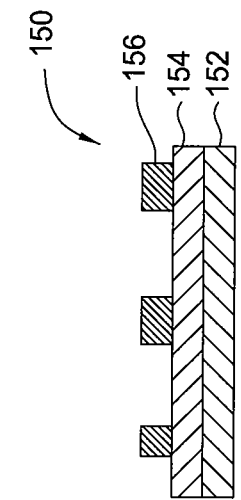
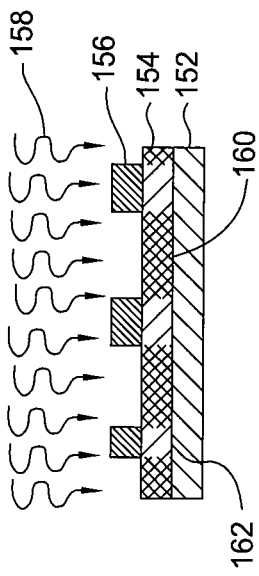
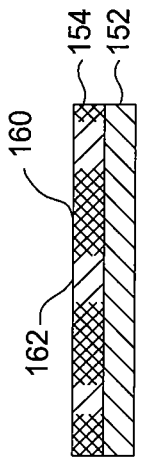
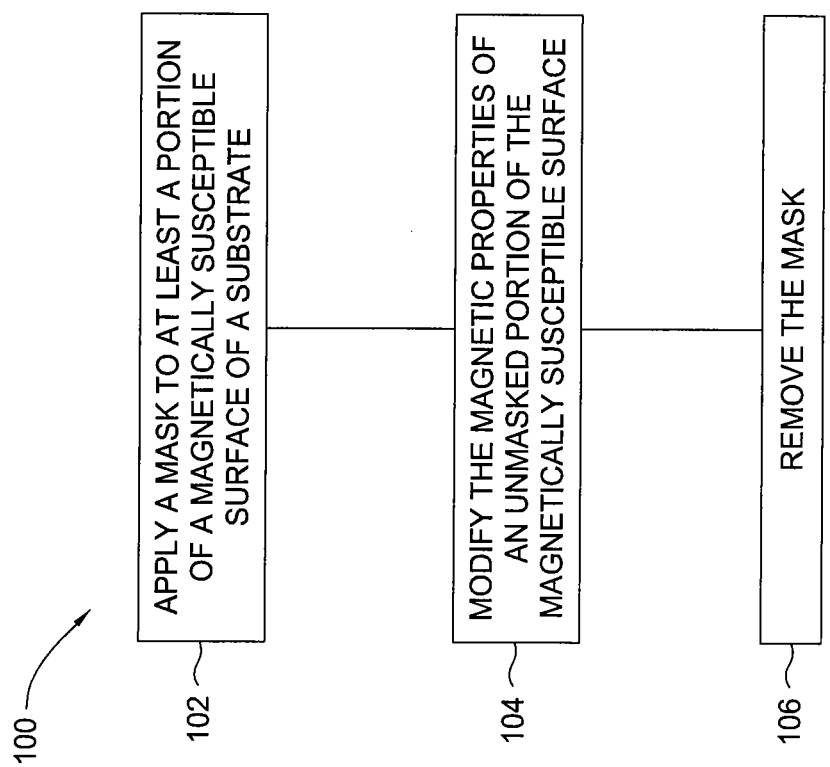

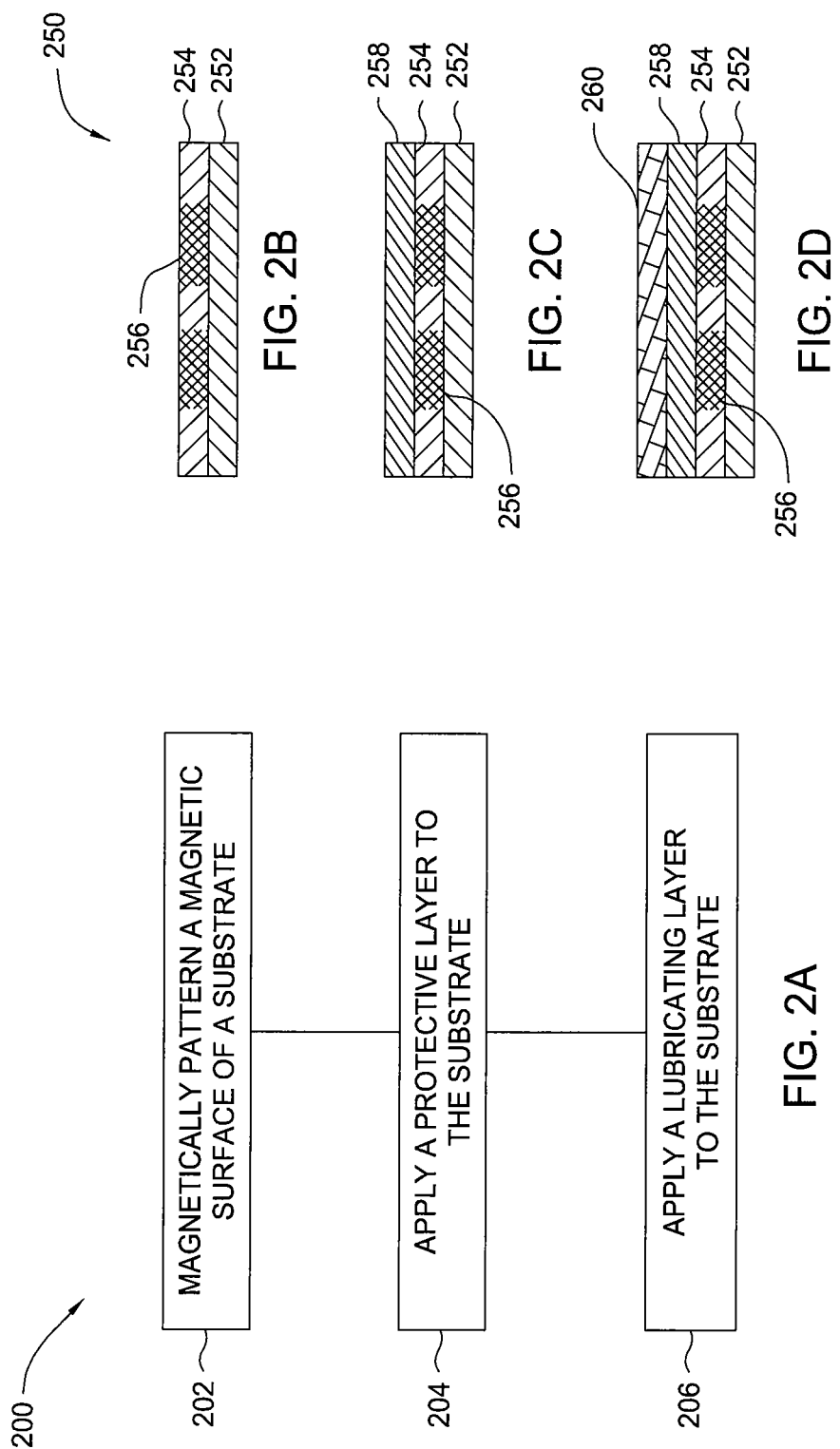

MODIFICATION OF MAGNETIC PROPERTIES OF FILMS USING ION AND NEUTRAL BEAM IMPLANTATION

CROSS-REFERENCE TO RELATED APPLICATIONS

This application claims benefit of U.S. Provisional Patent Application Ser. No. 61/168,879, filed Apr. 13, 2009, and incorporated herein by reference.

FIELD

Embodiments of the invention relate to hard-disk drive media, and apparatus and methods for making hard-disk drive media. More specifically, embodiments of the invention relate to methods and apparatus for forming a patterned magnetic medium for a hard-disk drive.

BACKGROUND

Magnetic layers, and magnetically susceptible layers are used for a number of applications in the electronics industry. In one prominent example, hard-disk drives are the storage medium of choice for computers and related devices. They are found in most desktop and laptop computers, and may also be found in a number of consumer electronic devices, such as media recorders and players, and instruments for collecting and recording data. Hard-disk drives are also deployed in arrays for network storage.

Hard-disk drives store information magnetically. The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

The magnetic medium in a hard-disk drive is generally a glass, composite glass/ceramic, or metal substrate, which is generally non-magnetic, with a magnetically susceptible material deposited thereon. The magnetically susceptible layer is generally deposited to form a pattern, such that the surface of the disk has areas of magnetic susceptibility interspersed with areas of magnetic inactivity. The non-magnetic substrate is usually topographically patterned, and the magnetically susceptible material deposited by spin-coating or electroplating. The disk may then be polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 $TB/in^2$, with individual domains having dimensions as small as 20 nm. Where domains with different spin orientations meet there is a region referred to as a Bloch wall in which the spin orientation goes through a transition from the first orientation to the second. The width of this transition region limits the areal density of information storage because the Bloch wall occupies an increasing portion of the total magnetic domain.

To overcome the limit due to Bloch wall width in continuous magnetic thin films the domains can be physically separated by a non-magnetic region (which can be narrower than the width of a Bloch wall in a continuous magnetic thin film). Conventional approaches to creating discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. A substrate may be masked and patterned, and a magnetic material deposited over exposed portions, or the magnetic material may be deposited before masking and patterning, and then etched away in exposed portions. In either case, the topography of the substrate is altered by the residual pattern of the magnetic regions. Because the read-write head of a typical hard-disk drive may fly as close as 2 nm from the surface of the disk, these topographic alterations can become limiting. Thus, there is a need for a process or method of patterning magnetic media that has high resolution and does not alter the topography of the media, and an apparatus for performing the process or method efficiently for high volume manufacturing.

SUMMARY

Embodiments of the invention provide a method of creating a pattern of magnetic domains on a magnetically susceptible surface of one or more substrates, comprising applying a mask to at least a portion of the magnetically susceptible surface to form a masked portion and an unmasked portion of the surface, modifying the magnetic characteristics of the unmasked portion of the magnetically susceptible surface by exposing the surface to directed energetic particles, each particle having energy between about 0.2 keV and 4.8 keV, and removing the mask.

Other embodiments provide a method of forming a magnetic medium, comprising forming a magnetic layer on a substrate, forming a mask over the magnetic layer to form a masked portion and an unmasked portion of the magnetic layer, and exposing the substrate to an ion beam, wherein the ions have average energy between about 0.2 keV and about 4.8 keV.

Other embodiments provide a method of forming a magnetic medium, comprising forming a magnetic layer on at least two major surfaces of a substrate, forming a mask over the magnetic layer on the at least two major surfaces of the substrate to form a masked portion and an unmasked portion of the magnetic layer, and modifying the magnetic properties of the unmasked portion of the at least two major surfaces of the substrate by exposing the unmasked portion to a particle beam.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a flow diagram summarizing a method according to one embodiment.

FIGS. 1B-1D are schematic side views of a substrate at various stages of the method of FIG. 1A.

FIG. 2A is a flow diagram summarizing a method according to another embodiment.

FIGS. 2B-2D are schematic side views of a substrate at various stages of the method of FIG. 2A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 3A:
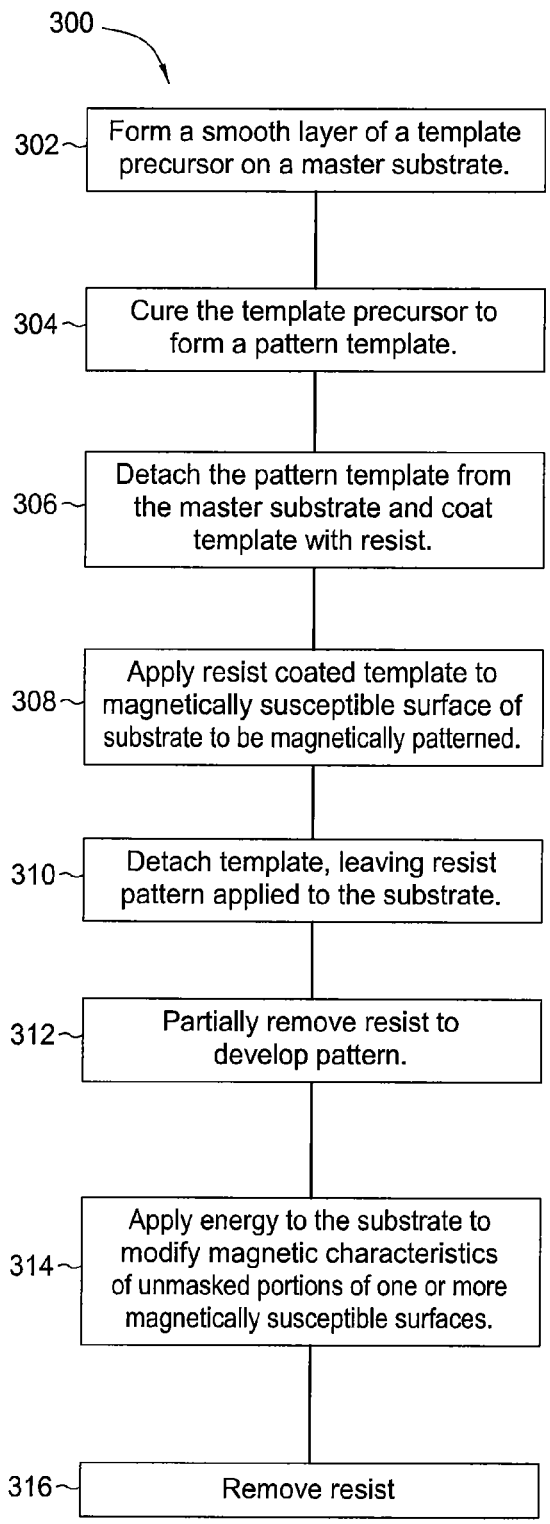
FIG. 3A is a flow diagram summarizing a method according to another embodiment of the invention.
Figure 3B:
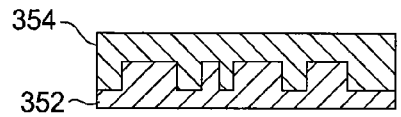
FIGS. 3B-3I show various articles used in the method at various stages of the method.
Figure 3C:
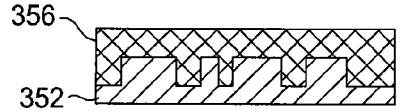
Figure 3D:
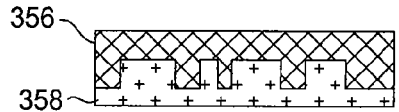
Figure 3E:
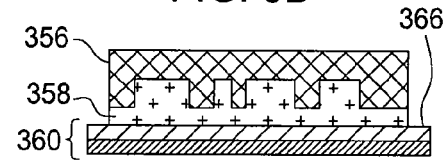
Figure 3F:
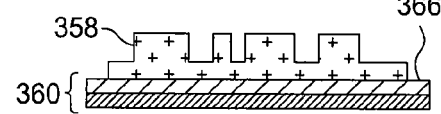
Figure 3G:
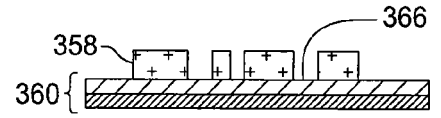
Figure 3H:
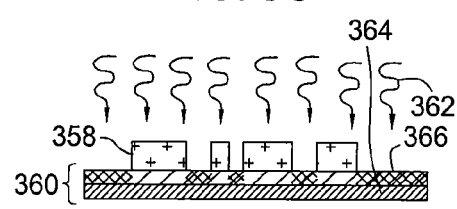
Figure 3I:
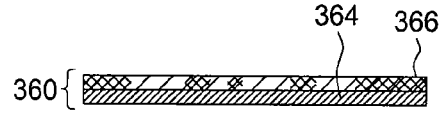

Embodiments of the invention generally provide apparatus and methods for processing magnetic media substrates, which can be used, for example, as storage media in hard disk drives. The apparatus and methods modify the magnetic properties of the substrate by applying energy to the substrate in a patterned way to create magnetic domains with different properties detectable and changeable by a magnetic head. The magnetic domains are separately addressable by a magnetic head held in proximity to the substrate surface, enabling the magnetic head to detect and affect the magnetic properties of an individual magnetic domain. Embodiments of the invention create magnetic domains having a dimension less than about 25 nm while preserving the topography of the substrate.

The substrates used are generally metal or glass, and may be metal alloys or composite glass substances such as glass/ceramic blends. The substrates are generally coated with a magnetically susceptible material that provides a medium for magnetic patterning. The magnetically susceptible material may be formed in multiple layers, each layer having the same or different composition. In one embodiment, a first layer of soft magnetic material, such as iron or and iron/nickel alloy, is formed over the base substrate, and a second layer of magnetic material, such as a cobalt/nickel/platinum alloy, is formed over the first layer. These layers may be formed by any suitable method known to the art, such as physical vapor deposition, or sputtering, chemical vapor deposition, plasma-enhanced chemical vapor deposition, spin-coating, plating by electrochemical or electroless means, and the like.

Following formation of a magnetic pattern in the magnetically susceptible material, described in more detail below, a protective layer is formed over the magnetically susceptible layer to prevent contact between the magnetic head and the magnetic medium. The protective layer is preferably magnetically inactive, and in some embodiments comprises carbon, such as amorphous or diamond-like carbon, or carbon nitride. The protective layer is also generally very thin, such as less than about 10 nm in thickness.

A lubricating layer may be formed over the protective layer to protect the magnetic head in the event of contact between the head and the substrate. The lubricating layer may be a lubricious polymer, such as a fluoropolymer, and may be deposited by any convenient method. The lubricating layer will also generally be thin, such as less than about 50 nm in thickness.

Embodiments of the invention provide methods and apparatus for establishing a magnetic pattern in one or more surfaces of a hard disk medium through a physical patterning process. A pattern template is coated with a mask material, and the template applied to the substrate to be patterned. The mask material is thus applied to the substrate according to the pattern of the template. A very detailed pattern having features of dimension less than about 25 nm may be imprinted on the substrate in this way. The mask may leave portions of the substrate completely exposed, or may cover some portions with a thin mask layer and others with a thick mask layer. The portions of the substrate that remain exposed, or covered with a thin mask layer, are essentially unmasked, while the other portions are masked. Unmasked portions of the substrate may then be exposed to energy to alter the magnetic properties of the unmasked portions. Upon removal of the mask, the substrate is left with its original topography, but with a very fine pattern of magnetic and non-magnetic domains capable of supporting storage densities in excess of 1 Tb/in$^2$.

FIG. 1A is a flow diagram summarizing a method 100 according to one embodiment of the invention. FIGS. 1B-1D are schematic cross-sectional views of a substrate 150 at various stages of the process of FIG. 1A. The substrate 150 has a base layer 152 and a magnetically susceptible layer 154. The base layer 152 is generally a structurally strong material such as metal, glass, ceramic, or a combination thereof. Many substrates commonly feature an aluminum or glass base layer, but other embodiments may feature carbon composite materials. The base layer 152 provides structural strength and good adhesion to the magnetically susceptible layer 154, and is generally magnetically impermeable with diamagnetic, or only very weak paramagnetic, properties. For example, in some embodiments, the magnetic susceptibility of the base layer is below about $10^{-4}$ (the magnetic susceptibility of aluminum is about $1.2 \times 10^{-5}$).

The magnetically susceptible layer 154 is generally formed from one or more ferromagnetic materials. In some embodiments, the layer 154 comprises a plurality of layers having the same or different compositions. In one embodiment, the layer 154 comprises a first layer and a second layer, wherein the first layer is a soft magnetic material, which is generally defined as a material with low magnetic coercivity, and the second layer has higher coercivity than the first layer. In some embodiments, the first layer may comprise iron, nickel, platinum, or combinations thereof. In some embodiments, the first layer may comprise a plurality of sub-layers having the same or different compositions. The second layer may also comprise a variety of materials, such as cobalt, chromium, platinum, tantalum, iron, terbium, gadolinium, or combinations thereof. The second layer may also comprise a plurality of sub-layers having the same or different compositions. In one embodiment, the magnetically susceptible layer 154 comprises a first layer of iron or iron/nickel alloy having a thickness between about 100 nm and about 1,000 nm (1 μm) and a second layer comprising two sub-layers, each having a thickness between about 30 nm and about 70 nm, such as about 50 nm, and each comprising chromium, cobalt, and platinum.

The magnetic surface is patterned to form domains of varying magnetic activity. To create the domain pattern, a mask material 156 is applied to the substrate 150 at 102. The mask material 156 generally comprises a material that can be readily removed without altering the magnetically susceptible layer 154 in any way, or a material that will not adversely affect the device properties if it is not removed. For example, in many embodiments, the mask material is soluble in a solvent liquid, such as water or hydrocarbon. In some embodiments, the mask is applied to the substrate as a curable liquid, patterned by physical imprint with a template, and cured by heating or UV exposure. In other embodiments, the mask is applied to the template and at least partially cured before applying the coated template to the substrate. The mask material 156 is generally also resistant to degradation by incident energy or energetic ions. In some embodiments, the mask material 156 is a curable material, such as an epoxy or thermoplastic polymer, that will flow prior to being cured and will provide some resistance to energetic processes after curing. The mask material defines masked and unmasked portions of the magnetically susceptible layer 154.

At 104, the magnetic properties of the unmasked portions of the magnetically susceptible layer 154 are modified. Energy 158 is directed toward the substrate 150, and impinges on the exposed unmasked portions of the magnetically susceptible layer 154. Exposing magnetic materials to energy will generally begin to disrupt and change the magnetic properties when the energy reaches sufficient intensity to stimulate thermal motion of the atoms in the material. Energy above a certain threshold will randomize the spin direction of the atoms, reducing or eliminating the magnetic properties of the material. In some embodiments, the magnetism or the magnetic susceptibility of the magnetically susceptible layer 154 may be reduced or eliminated by exposure to the energy 158. Magnetic susceptibility is the ease with which a material will acquire magnetism when exposed to a magnetic field. Modification of the unmasked portions of the magnetically susceptible layer 154 creates a pattern of domains defined by the unmodified zones 162 and the modified zones 160. The pattern may be recognized as domains of magnetic and non-magnetic material, domains of high and low magnetic field, or domains of high and low magnetic susceptibility. The mask material 156 is then removed at 106, leaving the substrate with a magnetically susceptible layer 154 having a pattern of domains defined by high activity zones 162 and low activity zones 160. The resulting substrate 150 has substantially the same topography as it had before processing.

FIG. 2A is a flow diagram summarizing a method 200 according to another embodiment of the invention. FIGS. 2B-2D are schematic side-views of a substrate 250 at various stages of the method of FIG. 2A. At 202, a magnetic surface of a substrate is patterned into regions having different magnetic properties in a process similar to that described in connection with FIGS. 1A-1D. FIG. 2B shows the substrate 250 having a base layer 252 and a magnetic layer 254. The base layer 252 and magnetic layer 254 may have properties similar to the base layer 152 and magnetically susceptible layer 154 described above. The patterned areas 256 of the magnetic surface 254 have different magnetic properties from the unpatterned areas. For example, the patterned areas 256 may be substantially demagnetized, or their magnetism or magnetic susceptibility may have been reduced or altered.

At 204, a protective layer 258 is formed on the substrate over the magnetic layer. The protective layer 258 prevents interaction of the magnetic surface with any materials that might degrade its properties, such as oxygen or moisture. The protective layer 258 may also be a sealing layer in some embodiments. In some embodiments, the protective layer 258 may comprise carbon, may comprise carbon and nitrogen, may be a carbon and nitrogen containing layer, may be an amorphous carbon layer, or may be a carbon nitride layer. In other embodiments, the protective layer 258 may be a polymer, which may comprise carbon. In some embodiments, the protective layer 258 may be a plastic or thermoplastic material. The protective layer is generally deposited in a low temperature process to avoid altering the magnetic properties of the magnetic layer 254.

At 206, a lubricating layer 260 is formed over the substrate. The lubricating layer 260 provides protection for a magnetic device (not shown) configured to detect and change the magnetic properties of regions of the magnetic layer 254 of the substrate 250. In the event of contact between the magnetic device and the substrate surface, the lubricating layer 260 will minimize frictional forces on the magnetic device that may damage the device. In some embodiments, the lubricating layer 260 may be a polymer, a carbon containing polymer, a fluorine containing polymer, a fluorine and carbon containing polymer, a fluoropolymer, a crystalline layer, or a diamond-like carbon layer. The lubricating layer 260 is generally also deposited in a low temperature process.

The methods 100 and 200 of FIGS. 1A and 2A feature patterning of a substrate surface into regions having different magnetic properties. In one embodiment, the substrate may be exposed to energetic ions using an ion beam generator. In one aspect, the ion beam may be configured to deliver ions of silicon, boron, oxygen, helium, nitrogen, argon, fluorine, neon, phosphorus, or arsenic to the substrate. In another aspect, the ion beam may deliver ions of phosphine ($PH_3$), methane ($CH_4$), ethane ($C_2H_6$), ethylene ($C_2H_4$), carbon tetrafluoride ($CF_4$), carbon monoxide (CO), carbon dioxide ($CO_2$), nitrous oxide ($NO_2$), ammonia ($NH_3$), boron trifluoride ($BF_3$), diborane ($B_2H_6$), nitrogen trifluoride ($NF_3$), arsine ($AsH_3$), diarsenic ($As_2$), diphosphorus ($P_2$), phosphorus tetrafluoride ($PF_4$), arsenic tetrafluoride ($AsF_4$), silicon tetrafluoride ($SiF_4$), silane ($SiH_4$), or disilane ($Si_2H_6$). In some aspects, the ion beam may deliver combinations or mixtures of the ions listed above. The ions listed above do not represent an exhaustive list of ions that may be used to bombard a substrate. Any ion that can be isolated in a vacuum without spontaneously decaying may be accelerated toward a substrate by an electric field.

In one embodiment, the ions are energized to an average impact energy at the substrate surface between about 0.2 keV and about 4.8 keV, such as between about 1.0 keV and about 4.0 keV, for example between about 0.2 keV and about 1.0 keV, or between about 1.0 keV and about 2.0 keV, or between about 2.0 keV and about 4.0 keV. In some embodiments, ions comprising more than one charged atom may have impact energy per atom between about 0.2 keV and about 4.8 keV, such as between about 1.0 keV and about 4.0 keV, for example between about 0.2 keV and about 1.0 keV, or between about 1.0 keV and about 2.0 keV, or between about 2.0 keV and about 4.0 keV.

In other embodiments, the magnetic properties of a substrate may be altered by exposure to energetic particles, such as ions, radicals, and neutral particles, which may involve implanting ions or merely exposing the substrate to low-energy ions without implanting. Bombarding the substrate without implanting ions, for example by directing ions having average energy less than about 1.0 keV, will change the magnetic properties through a purely energetic or thermal process by transferring the kinetic energy of the energetic ions to the magnetic surface, thereby inducing differential randomization of magnetic moments with each collision. Implanting ions will change the magnetic properties through energetic as well as compositional effects, randomizing magnetic moments near the implant site and imparting their own magnetic properties to the surface. Thus, the magnetic properties of the substrate surface may be changed by changing the composition of the substrate surface, the structure of the substrate surface, or both.

Substrates processed according to methods described herein have at least one surface with a pattern of magnetic domains formed therein. The magnetic domains are separated by domains having different magnetic properties. A first plurality of domains has a magnetic property with a first value, and a second plurality of domains has a second value, different from the first value, of the magnetic property. The domains of the first plurality are all separated by a domain of the second plurality. In one embodiment, the magnetic domains may have a magnetic field, or may be susceptible to magnetic coercion, whereas the separating domains are not magnetically active. The domains generally have dimension less than about 50 nm, such as between about 5 nm and about 50 nm, such as less than about 25 nm, such as between about 5 nm and about 25 nm. The areas with little magnetic activity usually comprise one or more elements from the group consisting of boron, nitrogen, hydrogen, oxygen, carbon, phosphorus, arsenic, fluorine, silicon, and germanium. Areas with residual magnetic activity show no such implantation. The magnetically active domains form readily identifiable boundaries with the magnetically inactive domains, and have measurably different magnetic properties.

Implanting using an ion or neutral beam generally results in a dopant concentration profile that has a maximum below the implanted surface. Thus, the doped areas of the magnetically active layer will have a dopant concentration that increases with depth near the surface of the magnetically active layer, reaches a maximum concentration, and then decreases with further depth thereafter. Implant depth generally depends on implant energy, so low energy implantation may produce a concentration maximum that is near the surface of the implanted material in some embodiments. The concentration maximum will generally be at a depth that is between about 5% and about 50% of the layer thickness. For a magnetically active layer that is 100 nm thick, the maximum dopant concentration will occur at a depth below the surface of the layer between about 5 nm and about 50 nm, such as about 30 nm. If the layer is 50 nm thick, the maximum dopant concentration will generally occur at a depth between about 2 nm and about 25 nm.

Energetic ions may be produced by use of an ion implanter such as the QUANTUM® X Plus implanter manufactured by Applied Materials, Inc., of Santa Clara, Calif. As is known in the art, an ion implanter dissociates electrons from atoms, selects ions having the desired energy through magnetic filtering, and accelerates the selected ions to the desired energy. The energy of the ions may be further tuned, or the ion beam focused, shaped, or directed if desired, between the ion beam emitter and the substrate by application of electromagnetics.

The process of altering the magnetic properties of substrates is facilitated by a patterning process. FIG. 3A is a flow diagram summarizing a method 300 according to another embodiment of the invention. FIGS. 3B-3I show various articles used in the method 300 at various stages of the method 300. At 302, a template precursor material 354 is applied to a master substrate 352 to acquire a pattern. The master substrate 352 expresses the master pattern to be developed on successive substrates according to the method 300. The master substrate 352 may comprise any durable material, such as metal, glass, or ceramic, and may be invested with an original pattern through any suitable process, such as any patterning process, for example by a deposition or etching process, or a combination thereof. In one embodiment, the master substrate may be patterned by an e-beam process. The e-beam process may comprise direct engraving with an electron beam or electron beam lithography followed by etching. In another embodiment, UV photolithography may be used to pattern the master substrate 352. The template precursor material 354 may be applied to the master substrate 352 as a gas or a liquid, and is preferably applied to form a smooth layer over the master substrate 352 using any suitable process, such as spin coating, die coating, or vapor deposition. The surface of the template precursor material 354 that interfaces with the master substrate 352 thus acquires the pattern recorded in the master substrate 352. In some embodiments, the template precursor material may be polyvinyl alcohol (PVA). In other embodiments, the template precursor material may be a curable polymer, such as an elastomer.

At 304, the template precursor material 354 may be cured to form a pattern template 356. The pattern template 356 will generally be a flexible solid material. The curing process may comprise heating, drying, or UV treating the template precursor material 354. After curing, the pattern template 356 will preferably have enough mechanical strength to be disengaged from the master substrate 352 without damaging or permanently distorting the pattern template 356. For example, liquid polyvinyl alcohol may be applied to a master substrate to a thickness of between about 10 nm and about 1,000 nm, such as between about 50 nm and about 200 nm, for example about 100 nm, by spin-coating, die-coating, or extrusion-coating, and then cured at a temperature between about 50° C. and about 300° C., such as about 100° C., for about 1 to 5 minutes to solidify.

At 306, the pattern template 356 is detached from the master substrate 352, and is coated with a resist material 358. The resist material 358 may be applied to the pattern template 356 as a liquid or a gas using any suitable process, such as spin coating, die coating, ink jet printing, or vapor deposition. The resist material 358 is applied to form a smooth layer over the pattern template 356. The resist layer is generally thin, such as between about 10 nm and about 100 nm, for example about 60 nm, thick.

At 308, the pattern template 356 with the resist material 358 is applied to a magnetically susceptible surface 366 of a substrate 360 to be magnetically patterned. This is usually done through a process of physical contact between the resist material 358 and the magnetically susceptible surface 366, and may require a precision alignment process. In some embodiments, a precision alignment is accomplished through visual or automated alignment of marks on the substrate 360, or device holding the substrate, and the pattern template 356. An optional curing process may be employed after physical contact is made between the resist material 358 and the magnetically susceptible surface 366, and may comprise heating, drying, or exposure to electromagnetic energy. The curing process may facilitate the resist material 358 adhering to the magnetically susceptible surface 366 with more force than it adheres to the pattern template 356.

At 310 the pattern template 356 is detached from the resist material 358, leaving the resist material 358, with pattern acquired from the pattern template 356, adhered to the substrate 360. At 312, the pattern is developed by removing a portion of the resist material 358, exposing the magnetically susceptible surface 366 underneath. In alternate embodiments, the resist may be used as applied without exposing any underlying surface, because subsequent processing may be configured to penetrate the thinner portions of the resist layer while being successfully obstructed by the thicker portions of the resist layer. Thus, removing a portion of the resist material 358 at 312 is optional. In most embodiments, the resist layer will generally be between about 30 nm and about 100 nm thick, such as between about 50 nm and about 70 nm thick. In many embodiments, the resist layer will have thick and thin portions, the thin portions calibrated to admit incident energy or particles, and the thick portions calibrated to block incident energy or particles. The thick portions therefore mask areas of the substrate surface they cover, whereas the thin portions expose areas they cover. In some embodiments, the resist layer will have thick portions having a first thickness and thin portions having a second thickness, wherein a ratio of the first thickness to the second thickness is between about 1.3 and about 1.8, or between about 1.4 and about 1.7, such as between about 1.5 and about 1.6. This thickness profile ratio may be used to tune implant depth, as described further below.

At 314, energy 362 is applied to the substrate 360 as described above in connection with FIGS. 1A-1D to modify the magnetic properties of unmasked portions 364 of the magnetically susceptible surface 366. Although the energy 362 is shown modifying the unmasked portions 364 through the entire thickness of the magnetically susceptible surface 366, it may be advantageous in some embodiments to modify only a portion of the layer near the surface of the magnetically susceptible surface 366. For example, deeper modification may be expected to lead to sharper differentiation of magnetic properties between the domains. Additionally, however, modification of properties may not proceed directly perpendicular to the magnetically susceptible surface 366. As energy 362 impinges on the surface 366, its effects may travel laterally through the layer to some extent, modifying the magnetic properties of domains not directly below the locus of impingement. This lateral spreading will degrade magnetic properties at the margins of the masked portions, reducing clarity of boundaries between the domains. For this reason, the desired depth of modification depends on the ratio of layer thickness to width or dimension of the unmasked portion being modified. At higher ratios of film thickness to width of unmasked portion, the desired depth of modification as a fraction of the total film thickness will be smaller.

After patterning at 314, the resist material is removed at 316, leaving the substrate 360 with magnetically susceptible surface 366 having a pattern of magnetic properties. The resist may be removed by etching with a chemistry that does not react with the underlying magnetic materials, such as a dry cleaning or ashing process, or by dissolving in a liquid solvent such as DMSO. In one example, due to the absence of permanent deposition on, or etching of, the magnetically susceptible surface 366, its topography after patterning is substantially identical to its topography before patterning.

Implanting ions deeply in the magnetic layer effects the most change to the magnetic properties of the implanted area. A shallow implant, such as 2-10 nm in a 100 nm thick layer will leave a significant portion of the layer beneath the implanted area with atomic spins in alignment. Such a shallow implant with ions having penetration energy between about 200 eV and about 1,000 eV will cause a partial change to the magnetic properties. Thus, the degree of change imposed may be selected by tuning the depth of the implant. The size of ion implanted will also affect the energy needed to implant to a given depth. For example, helium ions implanted into a magnetic material at an average energy of about 200 eV will demagnetize the magnetic material by about 20% to about 50%, and argon ions implanted at an average energy of about 1,000 eV will demagnetize by about 50% to about 80%.

The energy of ions reaching the surface of the substrate is influenced by the energy imparted to the ions by the implanter, the angle of incidence of the ions on the substrate, and by the thickness and hardness (i.e. resistance to ion penetration) of the resist material through which they travel to get to the substrate surface. The resist thickness, hardness, and thickness profile are independently chosen such that ions having a given energy range will penetrate the resist at desired locations and will not penetrate at other locations, and such that ions that penetrate the resist will have a desired energy upon reaching the surface of the substrate. Depth of implant may be tuned by adjusting the particle energy incident at the substrate surface beneath the resist. For example, implant depth will increase with increasing ion energy, decreasing resist thickness, and decreasing resist hardness. To prevent penetration of the higher energy ions through the blocking portions of the resist, those portions must be made thicker, without making the non-blocking portions thicker. Thus, increasing the thickness profile ratio of the resist enables patterned implanting to greater depth.

Applying a thin resist layer, coupled with low energy ion bombardment, may result in ions impacting the surface of the substrate without implanting into the surface. Such treatment may be beneficial in processes involving very thin magnetic layers, for example less than about 20 nm, and very small pattern features, for example less than about 10 nm. For such embodiments, ions having penetration energy of between about 200 eV and 1,000 eV may be applied to a thin resist layer having average thickness between about 30 nm and about 50 nm with thickness profile ratio between about 1.5 and about 2.0. Such a resist layer will have thin portions between about 20 nm and about 40 nm thick and thick portions between about 35 nm and about 70 nm thick. The thick portions of the resist prevent the low energy ions from reaching the substrate surface, while the thin portions reduce ion energy to a level between an implant threshold and a magnetic domain reorientation threshold. Depending on the material of the magnetic layer, the magnetic domain reorientation threshold may be between about 3 eV and about 30 eV, and the implant threshold may be between about 500 eV and about 1,000 eV. Thus, for materials with relatively low lattice cohesion, ions having kinetic energy from about 200 eV to about 500 eV may modify magnetic properties of the substrate surface without implanting. For materials with higher lattice cohesion, energies up to 1,000 eV may be used without implanting. As described above, the thickness of the resist layer may be adjusted to modulate the ion energy incident on the substrate surface. In some embodiments, the resist layer may be partially etched or dissolved prior to ion treatment to expose portions of the substrate surface, if desired.

The angle of incidence of energetic particles on the substrate may be adjusted to increase disordering of magnetic domains or to adjust the relative degree of impact disruption and implant disruption. Energetic particles may be directed toward the substrate at a first angle of incidence in a first treatment and a second angle of incidence different from the first angle of incidence in a second treatment to increase disruption of magnetic domains. In most embodiments, the angle of incidence during any beam treatment will be between about 0° (i.e. "vertical" or normal to the substrate surface) and about 7°, such as between about 2° and about 5°. Treatment with angled beam energy may result in some degree of pattern offset, so in some embodiments an offset dimension is determined prior to applying a patterned resist to the substrate. The offset dimension is incorporated when positioning the patterned resist on the substrate.

One or more substrates may be exposed to energetic particles from a beam by scanning the beam across the surface of the one or more substrates. A plurality of substrates may be processed concurrently in one chamber. More than one substrate may be simultaneously processed by disposing the substrates on a substrate carrier constructed of material selected to withstand the ion beam treatment and scanning the ion beam across the substrate carrier with the substrates disposed thereon. In one embodiment, the beam may be directed toward the center of the substrate or substrate carrier, and the substrate or substrate carrier's position with respect to the beam may be changed in a spiral fashion, expanding from center to edge to treat the entire substrate or substrate carrier. As the path of the ion beam spirals out from the center, it may be useful to overlap previous passes to an extent to improve uniformity of treatment. In some embodiments, the ion beam will have higher flux density near the center of the beam than near the edge of the beam. Moreover, portions of the substrate surface that pass near the center of the ion beam will receive more flux than portions that pass near the edge of the beam. Overlapping passes on the surface will at least partially compensate for these variations in flux density. Two major surfaces of each substrate may be exposed to a particle beam sequentially, for example by flipping each substrate. A protective layer may be formed over the two major surfaces, and a lubricant layer may be formed over the protective layer.

In the spiral embodiment described above, the substrate or substrate carrier may be disposed on a moveable support. The moveable support may be configured to move in one dimension or in two dimensions. A support moveable in two dimensions may be controlled by a controller to facilitate a spiral pattern. A support moveable in one dimension may be coupled with electromagnetics to adjust the ion beam in an orthogonal dimension, all under the control of a controller, to facilitate the spiral pattern.

In another embodiment, the ion beam may move in a raster scan pattern with respect to the substrate or substrate carrier. The beam traverses the substrate or carrier in an x-direction from one edge to the other, displaces a short distance in a y-direction orthogonal to the x-direction, and then traverses the substrate or carrier in the x-direction again, repeating until the entire substrate or carrier is scanned. The displacement in the y-direction is generally selected to allow some overlap of beam passes for reasons described above.

In another embodiment, the ion beam may be developed into a ribbon having a length unequal to its width using appropriate electromagnetics known in the art, and the ribbon may be scanned across the substrate or carrier. In one embodiment, the ribbon may have a length that is substantially equal to a dimension of the substrate or carrier, such as a diagonal, diameter, or maximum dimension, so that a single scan treats the entire substrate or carrier. In another embodiment, the ribbon may have a length that is shorter than a maximum dimension of the substrate or carrier, such as a radius, half diagonal, or half edge-length, so that two or more scans are required to treat the substrate or carrier. The width of the beam is selected to deliver the desired dose at the target scan rate.

In another embodiment, the ion beam may be developed into a shape that is non-circular, elongated, or irregular in some respect. The ion beam will generally be scanned across the substrate or carrier in a pattern similar to those described above to treat the substrate or carrier. The degree of overlap between passes of the beam will depend on the shape and intensity profile of the beam. In some embodiments, the ion beam has a cross-sectional shape that is oval, elliptical, or ellipsoidal.

In some embodiments, the ion beam may be partially or fully neutralized prior to impinging on the substrate. Ions leaving the beam column with the desired energy pass through a neutralizer containing a non-reactive gas such as argon, helium, or another noble gas. The ions exchange charge with the neutral atoms of the non-reactive gas and become neutral particles. The neutral particles impact the substrate, or the resist material disposed on the substrate, and disrupt the magnetic domains of the substrate according to the pattern of the resist as described elsewhere herein. The neutralizer may reduce the energy of the ions by virtue of their interaction with the neutralizing medium and increase their dispersion. To compensate, the ion beam may be over-energized or focused prior to passing through the neutralizer. Use of neutral particles may be beneficial in some embodiments to overcome beam spread due to space charge effects.

The resist thickness needed to stop penetration of energized ions through the resist layer is dependent upon the species being implanted, the process parameters, and the desired penetration depth of the ions into the magnetic thin film. As the dimension of the regions selected for implantation diminishes, thickness of the resist layer also diminishes to permit effective patterning. As the resist thickness decreases, the resist layer may no longer be able to mask portions of the substrate surface effectively. For this reason, in some embodiments it may be advantageous to adjust hardness of the resist as well as thickness.

Hardness of a resist layer may be adjusted by adding a dopant, such as a silicon containing compound, to the resist that increases the resistance to the penetration of charged ions. Other dopants that may be used to increase the resistance to the penetration of the charged ions include compounds containing sulfur and phosphorus. In one embodiment, nano particles can be added to tune resistance to the penetration of charged ions. For example, nano particles of aluminum oxide ($Al_2O_3$), silicon dioxide ($SiO_2$), ceria ($CeO_2$) and titanium dioxide ($TiO_2$) may be used in this way. In still other embodiments, resist hardness may be further adjusted by using different curing or drying processes. For resist materials that require curing or drying, more curing or drying such as by lengthening the curing or drying time or by increasing temperature, will generally result in a harder resist layer, which will be more resistant to penetration. Use of a harder resist layer may offer finer control of the energy content of incident ions with higher initial energy using a thinner resist layer.

Different element species have different effects on the magnetic properties based upon the process parameters and the desired penetration depth of the ions into the magnetic thin film. For example, one or more elements may be advantageously used to modify the magnetic properties of the magnetic film. In one embodiment, a combination of helium and boron may provide added benefit. For example, helium with less molecular weight can penetrate deeper into the magnetic thin film and change the magnetic properties, using less energy. Boron with a higher molecular weight may be used before, after, or along with the penetration of helium to further impact the magnetic properties of the magnetic thin film and also to act as a barrier for the helium ions from escaping from the magnetic thin film over time.

Elements such as boron and helium will disrupt magnetic domains of a substrate, reducing the magnetic susceptibility of areas treated with boron and helium ions. Other elements, however, may enhance magnetic susceptibility by adding their magnetic properties to the substrate. For example, a compound containing elements that increase the magnetic property of the thin film, such as platinum, may be used to enhance magnetic susceptibility of treated areas.

Figure 4:
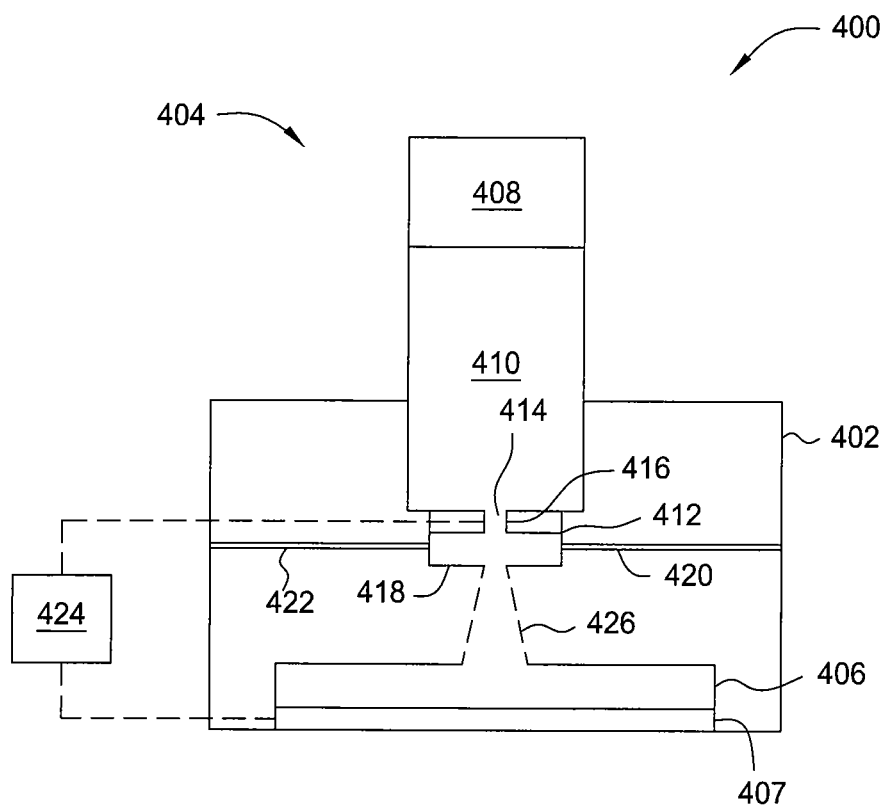
FIG. 4 is a schematic cross-sectional view of an apparatus according to an embodiment of the invention.

FIG. 4 is a schematic cross-sectional view of an apparatus 400 according to an embodiment of the invention. The apparatus 400 comprises a chamber 402 for processing one or more substrates, a beam column 404 for generating energetic particles, and a substrate support 406 for positioning one or more substrates to be treated.

The beam column 404 comprises an ion generator 408 and an accelerator 410 for moving the ions into the chamber 402. Ions move from the generator 408 through the accelerator and exit through opening 414 into an optional neutralizer 412. The neutralizer 412 may be used to convert the ions into neutrally charged particles, if desired.

The neutralizer 412 may comprise a gas chamber 418 and a focusing member 416 configured to focus the beam prior to neutralization so that the neutralized beam has the desired diameter upon impacting the one or more substrates. A neutralizing gas is provided to the gas chamber 418 through conduit 420 and absorbs electrical charge from the ion beam entering from the focusing member 416. The charged gas exits the gas chamber 418 through conduit 422. The beam focusing member 416 may also have electromagnetics for diverting the beam direction in one or two dimensions to impact different locations on the one or more substrates.

The beam 426 produced by the beam column 404, with or without neutralizer 412, impinges one or more substrates disposed on the substrate support 406. For embodiments featuring more than one substrate, the substrates may be disposed on a carrier (not shown in FIG. 4), which in turn is positioned on the substrate support. The beam 426 is directed toward all portions of all substrates disposed on the substrate support 406 by moving the substrates with respect to the beam 426. The substrate support 406 may be mounted on a moveable stage 407, which may be moveable in one or two directions. A stage 407 moveable in only one direction may be coupled with a focusing member 416 with the capability to divert the beam 426 in an orthogonal direction to reach all areas of the substrates. A stage 407 moveable in two directions may move the substrates with respect to the beam 426 such that all areas of the substrates may be treated.

Motion of the substrate support 406 on the moveable stage 407 may be controlled by a controller 424 capable of positioning the substrate support at any desired location along its range of motion. If the stage 407 is capable of motion in only one direction and the beam column 404 comprises a focus member 416 capable of diverting the beam 426 in a direction orthogonal to the travel direction of the stage 407, the controller 424 may be configured to control both the stage and the beam.

The beam column 404 of FIG. 4 may be configured to develop the beam 426 into a ribbon having unequal length and width. Electromagnetics may be disposed in the focus member 416 for elongating the shape of the beam, or even splitting the beam into multiple parallel beams, to form such a ribbon. For a ribbon beam having length substantially equal to a dimension of the substrate or carrier, the stage 407 may move the substrate or carrier in one direction only to accomplish exposure to the beam ribbon. Thus, a ribbon beam column coupled with a unidirectional stage 407 will suffice for exposing all areas of the one or more substrates disposed on the support 406.

Figure 5A:
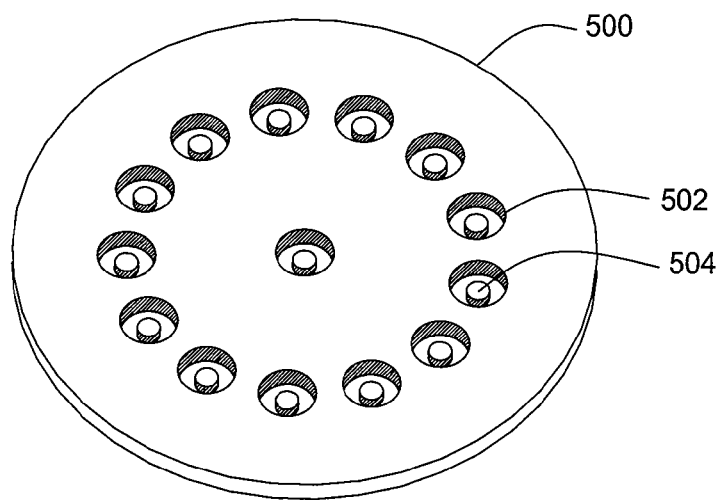
FIG. 5A is a perspective view of a substrate carrier according to one embodiment of the invention.
Figure 5B:
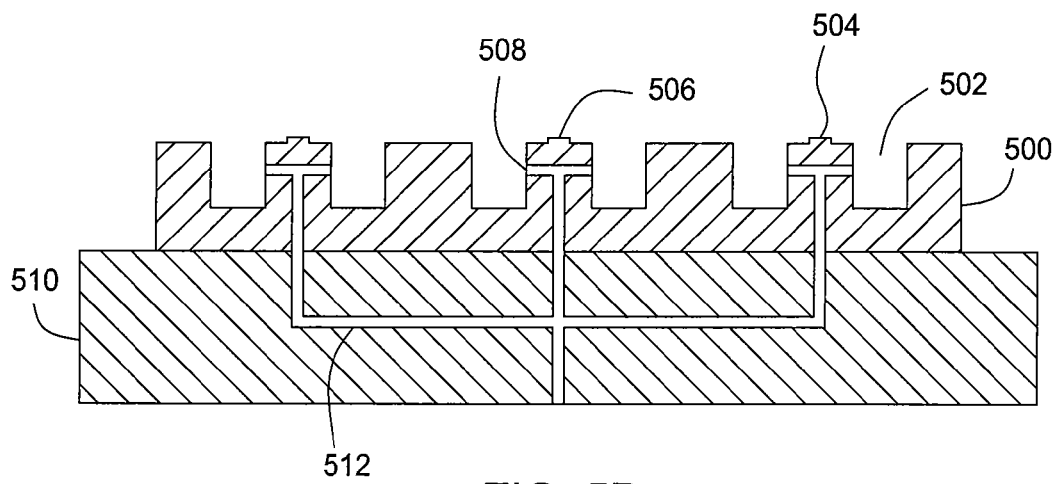
FIG. 5B is a cross-sectional view of a substrate carrier according to another embodiment of the invention.

FIGS. 5A and 5B are schematic illustrations of a substrate carrier 500 according to an embodiment of the invention. FIG. 5A shows the substrate carrier 500 in a perspective view, and FIG. 5B shows the substrate carrier 500 coupled to a support 510. The substrate carrier 500 has a plurality of substrate sites 502 for disposing substrates thereon. In the embodiment of FIG. 5A, the substrate sites 502 are illustrated as recessed areas of the carrier 500. Each substrate site 502 has a contact portion 504 for stabilizing the substrate. The substrate will generally rest on the contact portion 504, and extend outward toward the rim of the recessed site 502, creating a cavity beneath the substrate.

FIG. 5B illustrates the carrier 500 in cross-section coupled to a support 510. The contact portion 504 has an extension 506 for mating with an opening at the center of a substrate. The carrier 500 also has a plurality of conduits 508 disposed through the contact portions 504. The conduits 508 are in fluid communication with conduits 512 similarly disposed in the support 510. The conduits 512 and 508 provide means for applying a thermal control medium, such as a heating or cooling medium, to the cavity beneath each substrate disposed in a substrate site 502. For processes described herein which may require cooling of substrates, a cooling gas may be provided to the back side of the substrates through the conduits 512 and 508. In one embodiment, modifying the magnetic surface of the substrates may raise their temperature to a level sufficient to degrade the resist material or threaten the integrity of the magnetic layer. In such an embodiment, the substrate may be cooled during processing by applying a cool non-reactive gas, such as helium, argon, hydrogen, or nitrogen, to the substrate.

In an alternate embodiment of a substrate carrier, the substrate sites may be projections above the otherwise flat surface of the carrier. The projections may be shaped to mate with openings in the substrates such that the substrates are held above the flat surface of the carrier. The projections may comprise conduits similar to those described above for thermal control of the back side of each substrate.

In the substrate carrier of FIG. 5B, the conduits 508 are illustrated as projecting outward from the contact portion 504 at a 90° angle from a major axis of the contact portion 504. In alternate embodiments, the conduits 508 may be fitted with nozzles to shape or direct the flow of a thermal control medium in any desired way. For example, nozzles may divert the thermal control medium at an upward angle toward the substrate. In an alternate embodiment, the conduits 508 may be formed having an upward angle to direct a thermal control medium toward the substrate. In many embodiments, a heating or cooling gas may be used for thermal control with the substrate carrier of FIG. 5B.

Embodiments of the invention may apply to, and incorporate, various types of magnetic recording media. For, example, recording media having a granular magnetic structure may be manufactured. Also, multi-layered magnetic thin films may be used. A magnetic thin film that is also a continuous magnetic film may be used with patterned media. The patterned media may be bit patterned media or track patterned media. In one embodiment, the magnetic thin film may be made of highly anisotropic magnetic material, suitable for a thermally assisted magnetic recording.

While the foregoing is directed to embodiments of the invention, other and further embodiments of the invention may be devised without departing from the basic scope thereof.

What is claimed is:

1. A method of magnetically altering a magnetically susceptible surface, comprising:
    forming a patterned mask over at least a portion of the magnetically susceptible surface of one or more substrates to form a masked portion and an unmasked portion of the magnetically susceptible surface; and
    forming magnetic domains by modifying the magnetic characteristics of the unmasked portion of the magnetically susceptible surface by exposing the magnetically susceptible surface to neutral particles comprising an element selected from the group consisting of hydrogen, oxygen, fluorine, silicon, platinum, aluminum, and phosphorus, wherein the neutral particles are formed form ions of an ion beam, and wherein the neutral particles expose the unmasked portion of the magnetically susceptible surface to energy above a threshold sufficient to randomize spin direction of atoms of the magnetically susceptible surface, but insufficient energy to implant the neutral particles.

2. The method of claim 1, wherein modifying the magnetic characteristics of the unmasked portion comprises:
    disposing the one or more substrates on a support in an ion implant chamber;
    generating a beam of the neutral particles;
    directing the beam of the neutral particles toward successive locations on the one or more substrates; and
    exposing the unmasked portion of the magnetically susceptible surface to the neutral particles.

3. The method of claim 1, wherein the magnetically susceptible surface comprises a first surface and a second surface, the first surface and the second surface being exposed to the neutral particles sequentially.

4. A method of forming a magnetic medium, comprising:
    forming a magnetic layer on each of two or more substrate;
    forming a mask over the magnetic layer concurrently on each of the two or more substrates to form a masked portion and an unmasked portion of the magnetic layer on each of the two or more substrates;
    modifying the magnetic properties of the unmasked portion by exposing the unmasked portion of each of the two or more substrates concurrently to an ion beam, the ion beam comprising ions and neutral particles, wherein the neutral particles are formed from the ions of the ion beam, wherein the neutral particles comprise one or more elements selected from the group consisting of hydrogen, oxygen, fluorine, silicon, platinum, aluminum, and phosphorus, wherein the ions have an average energy between about 0.2 keV and about 4.8 keV, and wherein the neutral particles expose the unmasked portions of the magnetic layer to energy above a threshold sufficient to randomize spin direction of atoms of the magnetic layer, but insufficient energy for implantation; and
    removing the mask from each of the two or more substrates.

5. The method of claim 4, wherein the average energy of the ions is between about 1.0 keV and 4.0 keV.

6. The method of claim 4, wherein modifying the magnetic properties of the unmasked portion comprises:
    disposing the two or more substrates on a support in an ion implant chamber;
    generating a beam of neutral particles;
    directing the beam of neutral particles toward successive locations on the two or more substrates; and
    exposing the unmasked portion of the two or more substrates to the neutral particles.

7. The method of claim 4, wherein the ions at the unmasked portion of the magnetic layer have an average energy below an implant threshold of the magnetic layer and above the threshold sufficient to randomize spin direction of atoms of the magnetic layer.

8. The method of claim 4, wherein the neutral particles being formed from the ions of the ion beam comprises delivering the ions at a first energy to a neutralizer, the first energy being greater than a desired implantation energy for the ions.

9. The method of claim 4, wherein the forming the magnetic layer includes forming magnetic layers on each of a first surface and a second surface of each of the two or more substrates, the first surface and the second surface being exposed to the neutral particles sequentially.

* * * * *